(12) United States Patent
Yasusaka

(10) Patent No.: US 11,742,844 B2
(45) Date of Patent: Aug. 29, 2023

(54) VOLTAGE COMPARISON CIRCUIT

(71) Applicant: Rohm Co., Ltd., Kyoto (JP)

(72) Inventor: Makoto Yasusaka, Kyoto (JP)

(73) Assignee: Rohm Co., Ltd.

( * ) Notice: Subject to any disclaimer, the term of this patent is extended or adjusted under 35 U.S.C. 154(b) by 0 days.

(21) Appl. No.: 16/991,674

(22) Filed: Aug. 12, 2020

(65) Prior Publication Data

US 2021/0067149 A1 Mar. 4, 2021

(30) Foreign Application Priority Data

Sep. 4, 2019 (JP) ................................. 2019-160946

(51) Int. Cl.
H03K 5/24 (2006.01)

(52) U.S. Cl.
CPC .................................. H03K 5/2472 (2013.01)

(58) Field of Classification Search
CPC ...... G01R 19/00; G01R 19/0038; H03K 5/00; H03K 5/24; H03K 5/2418; H03K 5/2472; H03K 5/2481; H03K 5/249
USPC .......................................................... 327/63
See application file for complete search history.

(56) References Cited

U.S. PATENT DOCUMENTS

| | | | |
|---|---|---|---|
| 4,804,892 A * | 2/1989 | Muller | H02P 6/08 318/400.17 |
| 6,411,483 B1 * | 6/2002 | Sarles | H02M 3/156 361/18 |
| 2002/0125942 A1 | 9/2002 | Dunnebacke et al. | |
| 2008/0238513 A1 * | 10/2008 | Poenaru | H03K 3/012 327/205 |
| 2014/0354352 A1 * | 12/2014 | Noro | H03F 3/217 330/10 |

FOREIGN PATENT DOCUMENTS

| | | |
|---|---|---|
| CN | 101394165 | 3/2009 |
| JP | H02-213216 | 8/1990 |
| JP | H07-174797 | 7/1995 |
| JP | 2008-103995 | 5/2008 |
| JP | 2008103995 A * | 5/2008 |

OTHER PUBLICATIONS

Storr, W. (Aug. 2, 2022). Op-amp Comparator. Basic Electronics Tutorials, https://www.electronics-tutorials.ws/opamp/op-amp-comparator.html, accessed Dec. 2, 2022. (Year: 2022).*

* cited by examiner

*Primary Examiner* — Daniel C Puentes
(74) *Attorney, Agent, or Firm* — Fish & Richardson P.C.

(57) ABSTRACT

A comparator receives a target voltage and a reference voltage at its inverting and non-inverting input terminals, and outputs a signal corresponding to the level relationship between those voltages A node provided on the output side of the comparator is fed with a signal equivalent to the output signal of the comparator. Between the node and the non-inverting input terminal of the comparator, a capacitor is inserted.

4 Claims, 9 Drawing Sheets

VOLTAGE COMPARISON CIRCUIT

CROSS-REFERENCE TO RELATED APPLICATIONS

This nonprovisional application claims priority under 35 U.S.C. § 119(a) on Patent Application No. 2019-160946 filed in Japan on Sep. 4, 2019, the entire contents of which are hereby incorporated by reference.

BACKGROUND OF THE INVENTION

1. Field of the Invention

The present invention relates to a voltage comparison circuit.

2. Description of Related Art

FIG. 16 shows a common voltage comparison circuit 900 with a hysteresis function The voltage comparison circuit 900 generates a reference voltage Vb by dividing a predetermined direct-current voltage $V_{DC}$, and compares a comparison target voltage Va with the reference voltage Vb using a comparator 901. The voltage division ratio used when the reference voltage Vb is generated is changed in accordance with the output signal of the comparator 901, and thereby the comparator 901 is given hysteresis.
Patent Document 1: Japanese Unexamined Patent Application Publication No. 2008-103995

In a voltage comparison circuit like the voltage comparison circuit 900, if noise is present in the input signal to the comparator, a change may occur in the output signal level of the comparator at a time at which no change is expected to occur. In particular, for example, in a device provided with a voltage comparison circuit, a level change in the output signal of a comparator is often used as a trigger to start or stop the operation of another circuit or to switch operation modes. Accordingly, immediately after a level change in the output signal, comparatively large noise may appear in the input signal to the comparator, and this can make the output of the comparator unstable (this will be described in detail later).

SUMMARY OF THE INVENTION

An object of the present invention is to provide a voltage comparison circuit that contributes to output stabilization.

According to one aspect of the present invention, a voltage comparison circuit includes, a comparator configured to receive a first voltage and a second voltage, to output a signal with a predetermined first level in a first slate where the level of the first voltage is lower than the level of the second voltage, and to output a signal with a predetermined second level different from the first level in a second state where the level of the first voltage is higher than the level of the second voltage; and a capacitor inserted between art input-side node fed with the first or second voltage and an output-side node fed with a signal corresponding to the output signal of the comparator. (A first configuration.)

In the voltage comparison circuit of the first configuration described above, preferably, when a shift from the first state to the second state causes a change in the level of the output signal of the comparator from the first level to the second level, an alternating-current signal based on the change is delivered from the output-side node via the capacitor to the input-side node and thereby the level of the first voltage is momentarily raised or rive level of the second voltage is momentarily lowered, or when a shirt from the second state to the first state causes a change in the level of the output signal of the comparator from the second level to the first level, an alternating-current signal based on the change is delivered from the output-side node via the capacitor to the input-side node and thereby the level of the first voltage is momentarily lowered or the level of the second voltage is momentarily raised. (A second configuration.)

In the voltage comparison circuit of the first or second configuration described above, preferably, the comparator has a first input terminal for receiving the first voltage and a second input terminal for receiving the second voltage, the input-side node is the first or second input terminal, and the output-side node is fed with a signal of which the level changes synchronously as the level of the output signal of the comparator changes. (A third configuration.)

In the voltage comparison circuit of the third configuration described above, preferably, there is further provided a second-voltage division circuit configured to generate the second voltage by dividing a predetermined voltage using a plurality of voltage division resistors connected in series with each other. Preferably, the capacitor is inserted between the output-side node and the second input terminal as the input-side node, the second voltage appears at the connection node between a first voltage division resistor and a second voltage division resistor included in the plurality of voltage division resistors, and the connection node is connected to live second input terminal of the comparator. (A fourth configuration.)

In the voltage comparison circuit of the fourth configuration described above, preferably, the capacitor and the voltage division resistors in the second-voltage division circuit together constitute a high-pass filter so that, when the level of the output signal of the comparator changes between the first and second levels, an alternating-current signal based on the change is delivered from the output-side node via the capacitor to the second input terminal. (A fifth configuration.)

In the voltage comparison circuit of the fourth or fifth configuration described above, preferably, the second-voltage division circuit is configured to give the comparator hysteresis by varying, in accordance with the output signal of the comparator, the division ratio used when the second voltage is generated from the predetermined voltage. (A sixth configuration.)

In the voltage comparison circuit of the fourth or fifth configuration described above, preferably, there is further provided a first-voltage division circuit configured to generate the first voltage by dividing an input voltage using a plurality of other voltage division resistors connected in series with each other. Preferably, the first-voltage division circuit is configured to give the comparator hysteresis by varying, in accordance with the output signal of the comparator, the division ratio used when the first voltage is generated from the input voltage. (A seventh configuration.)

In the voltage comparison circuit of the third configuration described above, preferably, there is further provided a first-voltage division circuit configured to generate the first voltage by dividing an input voltage using a plurality of voltage division resistors connected in series with each other. Preferably, the capacitor is inserted between the output-side node and the first input terminal as the input-side node, the first voltage appears at the connection node between a first voltage division resistor and a second voltage division resistor included in the plurality of voltage division resistors, and the connection node is connected to the first input terminal of the comparator. (An eighth configuration.)

In the voltage comparison circuit of the eighth configuration described above, preferably, the capacitor and the voltage division resistors in the first-voltage division circuit together constitute a high-pass filter so that, when the level of the output signal of the comparator changes between the first and second levels, an alternating-current signal based on the change is delivered from the output-side node via the capacitor to the first input terminal. (A ninth configuration.)

In the voltage comparison circuit of the eighth or ninth configuration described above, preferably, the first-voltage division circuit is configured to give the comparator hysteresis by varying, in accordance with the output signal of the comparator, the division ratio used when the first, voltage is generated front the input voltage. (A tenth configuration.)

In the voltage comparison circuit of the eighth or ninth configuration described above, preferably, there is further provided a second-voltage division circuit configured to generate the second voltage by dividing a predetermined voltage using a plurality of other voltage division resistors connected in series with each other. Preferably, the second-voltage division circuit is configured to give the comparator hysteresis by varying, in accordance with the output signal of the comparator, the division ratio used whew the second voltage is generated from the predetermined voltage. (An eleventh configuration.)

According to another aspect of the present invention, the voltage comparison circuit of any of the first to eleventh configurations described above is formed as a semiconductor integrated circuit. (A twelfth configuration.)

According to the present invention, it is possible to provide a voltage comparison circuit that contributes to output stabilization.

DETAILED DESCRIPTION OF PREFERRED EMBODIMENTS

Hereinafter, examples embodying the present invention will be described specifically with reference to the accompanying diagrams. Among the diagrams referred to in the course, the same parts are identified by the same reference signs, and in principle no overlapping description of the same parts will be repeated. In the present specification, for the sake of simple description, symbols and other designations referring to information, signals, physical quantities, elements, components, and the like are occasionally used with the names of the corresponding information, signals, physical quantities, elements, components, and the like omitted or abbreviated. For example, a reference voltage mentioned later and identified by the reference sign "$V_{REF}$" is sometimes designated as "reference voltage $V_{REF}$" and is other times abbreviated to "Voltage $V_{REF}$", both referring to the same entity.

First, some of the terms used to describe embodiments of the present invention will be defined.

"Ground" refers to a conducting part at a reference potential of 0 V (zero volts), or to such a reference potential itself. A potential of 0 V is occasionally referred to as a ground potential. In embodiments of the present invention, any voltage mentioned with no particular reference mentioned is a potential relative to the ground. "Level" denotes the level of a potential, and for any signal or voltage, "high level" has a higher potential than "low level". For any signal or voltage, its being at high level means its level being at high level, and its being at low level means its level being at low level. A level of a signal is occasionally referred to as a signal level, and a level of a voltage is occasionally referred to as a voltage level. For a given signal of interest, if the signal of interest is at high level, the inversion signal of the signal of interest is at low level; if the signal of interest is at low level, the inversion signal of the signal of interest is at high level.

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply for any transistor that is not classified as an FET. In the following description, for any transistor, its being in an on or off state is often referred to simply as its being on or off respectively. For any transistor, a switch from an off state to an on state is referred to as turning-on, and a switch from an on state to an off state is referred to as turning-off.

First Embodiment

Figure 1:
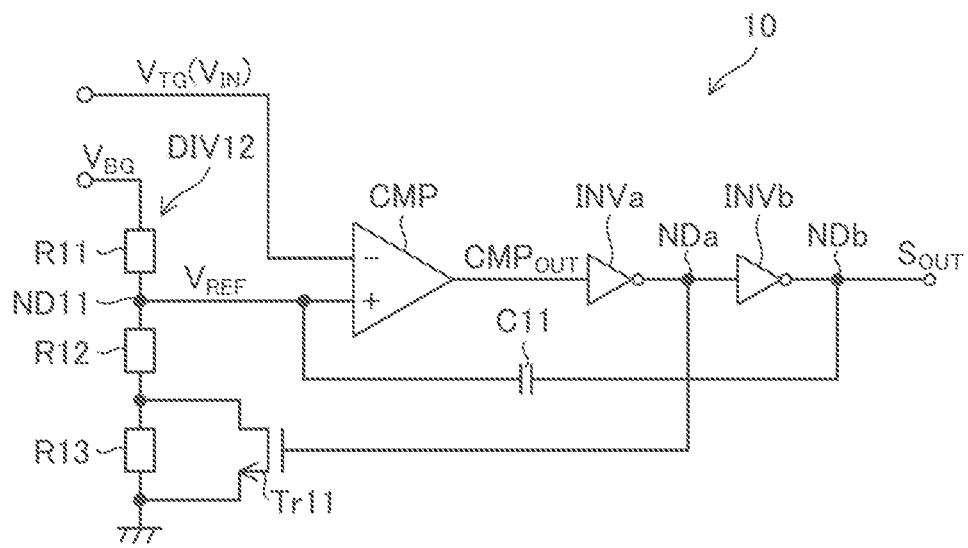
FIG. 1 is a circuit diagram of a voltage comparison circuit according to a first embodiment of the present invention.

A first embodiment of the present invention will be described. FIG. 1 is a circuit diagram of a voltage comparison circuit 10 according to the first embodiment of the present invention. The voltage comparison circuit 10 includes a comparator CMP, inverters INVa and INVb, a capacitor C11, a transistor Tr11, and resistors R11, R12, and R13 as voltage division resistors. The voltage comparison circuit 10 is a voltage comparison circuit with a hysteresis function (the same is true with any voltage comparison circuit mentioned later).

The resistors R11, R12, and R13 constitute a voltage division circuit DIV12 that divides a predetermined voltage $V_{BG}$ to generate a reference voltage $V_{REF}$. The resistors R11, R12, and R13 are connected in series with each other, and the predetermined voltage $V_{BG}$ is applied across the series circuit of the resistors R11, R12, and R13. The voltage $V_{BG}$ is, for example, a direct-current voltage that is generated using a band-gap reference, and has a predetermined fixed direct-current voltage value (the same is true with any embodiment described later). Specifically, one terminal of the resistor R11 is fed with the potential of the predetermined voltage $V_{BG}$, the other terminal of the resistor R11 and one terminal of the resistor R12 are connected together at a node ND11, the other terminal of the resistor R12 is connected to one terminal of the resistor R13, and the other terminal of the resistor R13 is connected to the ground. The voltage that appears at the node ND11 serves as the reference voltage $V_{REF}$ in the voltage comparison circuit 10.

The comparator CMP has an inverting input terminal, at which it receives a target voltage $V_{TG}$; a non-inverting input terminal, at which it receives the reference voltage $V_{REF}$; and an output terminal. The comparator CMP compares the target voltage $V_{TG}$ with the reference voltage $V_{REF}$, and outputs, from its output terminal, a signal $CMP_{OUT}$ corresponding to the level relationship between the voltages $V_{TG}$ and $V_{REF}$. When the target voltage $V_{TG}$ is lower than the reference voltage $V_{REF}$, the comparator CMP outputs, from its output terminal, a high-level signal $CMP_{OUT}$; when the target voltage $V_{TG}$ is higher than the reference voltage $V_{REF}$, the comparator CMP outputs, from its output terminal, a low-level signal $CMP_{OUT}$. When the target voltage $V_{TG}$ equals the reference voltage $V_{REF}$, the signal $CMP_{OUT}$ is at either high level or low level.

The inverter INVa has an input terminal and an output terminal, and the input terminal of the inverter INVa is connected to the output terminal of the comparator CMP. The inverter INVa outputs, from its output terminal, the inversion signal of the output signal $CMP_{OUT}$ of the comparator CMP. The inverter INVb has an input terminal and an output terminal, and the input terminal of the inverter INVb is connected to the output terminal of the inverter INVa. The inverter INVb outputs, from its output terminal, the inversion signal of the output signal of the inverter INVa.

Thus, when the output signal $CMP_{OUT}$ of the comparator CMP is at high level, the output signal of the inverter INVa is at low level and the output signal of the inverter INVb is at high level. When the output signal $CMP_{OUT}$ of the comparator CMP is at low level, the output signal of the inverter INVa is at high level and the output signal of the inverter INVb is at low level. The node at which the output terminal of the inverter INVa and the input terminal of the inverter INVb are connected together is referred to as a node NDa, and the output terminal of the inverter INVb is referred to as a node NDb (the same is true with any embodiment described later). The nodes NDa and NDb are fed with signals of which the levels change in synchronization with the level change in the output signal $CMP_{OUT}$ of the comparator CMP.

In the voltage comparison circuit 10, the output signal of the inverter INVb appears at the output terminal of the voltage comparison circuit 10, and serves as the output signal $S_{OUT}$ of the voltage comparison circuit 10. The output signal $S_{OUT}$ is, like the output signal $CMP_{OUT}$ of the comparator CMP, a signal that corresponds to the level relationship between the voltages $V_{TG}$ and $V_{REF}$ (the same is true with any embodiment described later). In the voltage comparison circuit 10, the target voltage $V_{TG}$ is an input voltage $V_{IN}$ that is supplied from outside. The target voltage $V_{TG}$ may instead be a voltage resulting from dividing the input voltage $V_{IN}$ with an unillustrated voltage division circuit.

The transistor Tr11 is a switching element that is connected in parallel with the resistor R13 to open or short-circuit across the resistor R13. Here, the transistor Tr11 is assumed to be configured as an N-channel MOSFET, with the drain of the transistor Tr11 connected to the connection node between the resistors R12 and R13, the source of the transistor Tr11 connected to the ground, and the gate of the transistor Tr11 connected to the node NDa.

When the signal at the node NDa (i.e., the output signal of the inverter INVa) is at low level, the transistor Tr11 is off to open across the resistor R13. When the signal at the node NDa (i.e., the output signal of the inverter INVa) is at high level, the transistor Tr11 is on to short-circuit across the resistor R13. Thus, when the resistance values of the resistors R11, R12, and R13 are represented by the symbols R11, R12, and R13 respectively, with the transistor Tr11 off, $V_{REF}=V_{A1}=V_{BG}/(R12+R13)/(R11+R12+R13)$ and, with the transistor Tr11 on, $V_{REF}=V_{A2}=V_{BG}\times R12/(R11+R12)$. Here, the on-state resistance of the transistor Tr11 is assumed to be low enough to be ignored (the same is true with any transistor mentioned later). The voltages $V_{A1}$ and $V_{A2}$ are identified in FIG. 2, and naturally the relationship $V_{A1}>V_{A2}$ holds. Thus, the resistors R11 to R13 constitute the voltage division circuit DIV12 that divides the predetermined voltage $V_{BG}$ to generate the reference voltage $V_{REF}$, and the voltage division ratio here changes in accordance with the signal at the node NDa (and hence the output signal of the comparator CMP); this gives the comparator CMP hysteresis.

The comparator CMP being given hysteresis means that the voltage value $V_{INVAL1}$ of the input voltage $V_{IN}$ that triggers a switch from the state $V_{TG}<V_{REF}$ to the state $V_{TG}>V_{REF}$ (i.e., that causes the signals $CMP_{OUT}$ and $S_{OUT}$ to switch from high level to low level) and the voltage value $V_{INVAL2}$ of the input voltage $V_{IN}$ that triggers a switch from the state $V_{TG}>V_{REF}$ to the state $V_{TG}<V_{REF}$ (i.e., that causes the signals $CMP_{OUT}$ and $S_{OUT}$ to switch from low level to high level) fulfill the relationship $V_{INVAL1}>V_{INVAL2}$ (the same is true with any embodiment described later). The difference ($V_{INVAL1}-V_{INVAL2}$) is referred to as the hysteresis width. In a case where the input voltage $V_{IN}$ itself is the target voltage $V_{TG}$, then, in the voltage comparison circuit 10, the voltage values $V_{INVAL1}$ and $V_{INVAL2}$ are equal to the above-mentioned voltages $V_{A1}$ and $V_{A2}$ respectively.

In the voltage comparison circuit 10, the capacitor C11 is inserted between the node NDb and the non-inverting input terminal of the comparator CMP. That is, one terminal of the capacitor C11 is connected to the node NDb, and the other terminal of the capacitor C11 is connected to the non-inverting input terminal of the comparator CMP. The connection node ND11 between the resistors R11 and R12 also is connected to the non-inverting input terminal of the comparator CMP. Thus, the resistors R11 to 13 and the capacitor C11 together constitute a high-pass filter that delivers the alternating-current component of the signal at the node NDb to the node ND11 and to the non-inverting input terminal of the comparator CMP. Accordingly, when the level of the signal $CMP_{OUT}$ changes between low and high levels, an alternating-current signal based on the change is delivered from the node NDa via the capacitor C11 to the nixie ND11 and to the non-inverting input terminal of the comparator CMP, with the result that the alternating-current signal is superposed on the reference voltage $V_{REF}$. For example, the serial composite resistance value of the resistors R11 to R13 is several megohms, and the capacitance value of the capacitor C11 is from 1 pF (picofarad) to several picofarads.

Figure 2:
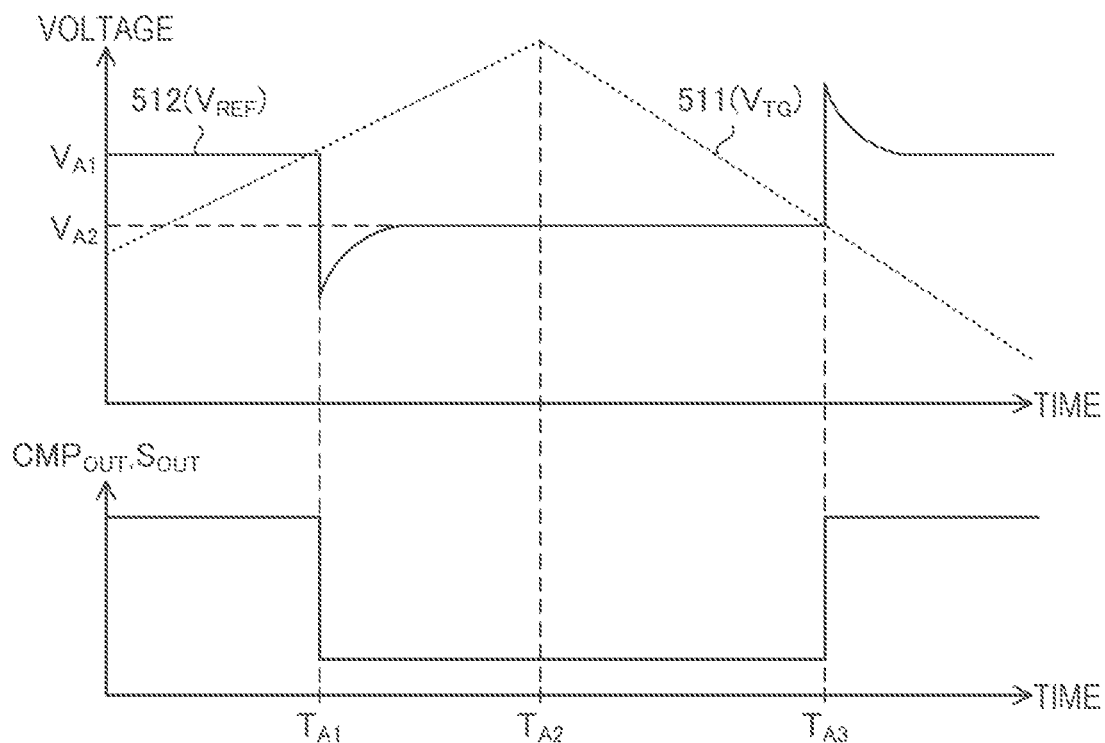
FIG. 2 is a timing chart of the voltage comparison circuit according to the first embodiment of the present invention.

FIG. 2 is a timing chart of the voltage comparison circuit 10. In FIG. 2, a broken-line plot 511 represents the waveform of the target voltage $V_{TG}$, and a partly curved solid-line waveform 512 is the waveform of the reference voltage $V_{REF}$. Before time point $T_{A1}$, $V_{TG} < V_{REF}$ all the time, and accordingly the output signals $CMP_{OUT}$ and $S_{OUT}$ remain at high level. Thus, before time point $T_{A1}$, the transistor Tr11 is off, and thus $V_{REF} = V_{A1}$.

In the example of FIG. 2, from a time point before time point $T_{A1}$ to time point $T_{A2}$, the target voltage $V_{TG}$ increases monotonically, and at time point $T_{A1}$, a shift from the state $V_{TG} < V_{A1}$ to the state $V_{TG} > V_{A1}$ takes place. Thus, at time point $T_{A1}$, the output signals $CMP_{OUT}$ and $S_{OUT}$ switch from high level to low level. In response to the output signal $CMP_{OUT}$ switching from high level to low level, the signal at the node NDa switches from low level to high level; thus, the transistor Tr11 turns on, and at time point $T_{A1}$, a switch from the state $V_{REF} = V_{A1}$ to the state $V_{REF} = V_{A2}$ takes place. It should be noted that the switch here is a switch in the direct-current component of the reference voltage $V_{REF}$. More specifically, at time point $T_{A1}$, a switch from the state where the direct-current component of the reference voltage $V_{REF}$ equals the voltage $V_{A1}$ to the state where it equals the voltage $V_{A2}$ takes place.

On the other hand, as a result of the output signal $S_{OUT}$ switching from high level to low level, a current momentarily passes through the above-mentioned high-pass filter that includes the capacitor C11. Thus, starting at time point $T_{A1}$, the reference voltage $V_{REF}$ is momentarily lower than the voltage $V_{A2}$ for the period in which that current passes, by the amount of voltage proportional to that current.

In the example of FIG. 2, from time point $T_{A2}$ via time point $T_{A3}$ to a time point after time point $T_{A3}$, the target voltage $V_{TG}$ decreases monotonically, and at time point $T_{A3}$, a shift from the state $V_{TG} > V_{A2}$ to the state $V_{TG} < V_{A2}$ takes place. Thus, at time point $T_{A3}$, the output signals $CMP_{OUT}$ and $S_{OUT}$ switch from low level to high level. In response to the output signal $CMP_{OUT}$ switching from low level to high level, the signal at the node NDa switches from high level to low level; thus, the transistor Tr11 turns off, and at time point $T_{A3}$, a switch from the state $V_{REF} = V_{A2}$ to the state $V_{REF} = V_{A1}$ takes place. It should be noted that the switch here is a switch in the direct-current component of the reference voltage $V_{REF}$. More specifically, at time point $T_{A3}$, a switch from the state where the direct-current component of the reference voltage $V_{REF}$ equals the voltage $V_{A2}$ to the state where it equals the voltage $V_{A1}$ takes place.

On the other hand, as a result of the output signal $S_{OUT}$ switching from low level to high level, a current momentarily passes through the above-mentioned high-pass filter that includes the capacitor C11. Thus, starting at time point $T_{A3}$, the reference voltage $V_{REF}$ is momentarily higher than the voltage $V_{A1}$ for the period in which that current passes, by the amount of voltage proportional to that current.

Figure 16:
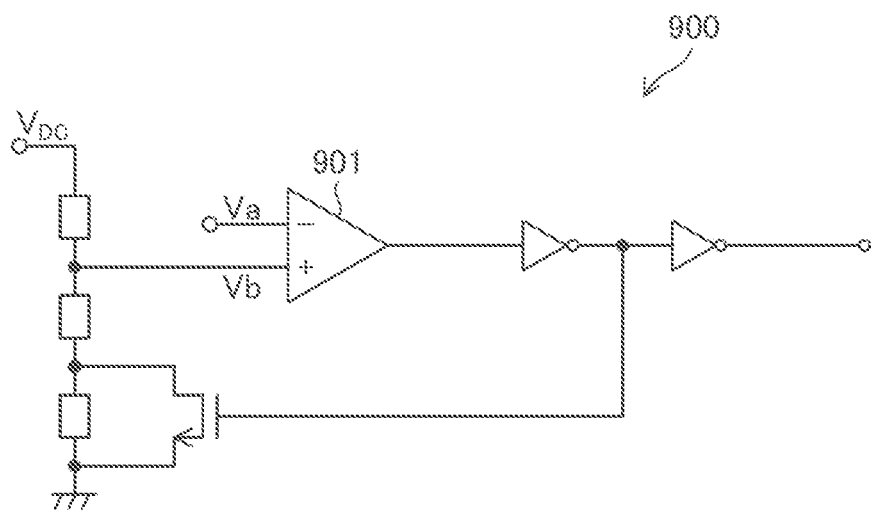
FIG. 16 is a circuit diagram of a voltage comparison circuit according to a reference configuration.

In FIG. 2, it is assumed that no noise is present in the input signal to the comparator CMP. In practice, noise can be present in the input signal to the comparator CMP. In particular, a level change in the signal $CMP_{OUT}$ is often used as a trigger to start or stop the operation of another circuit in the device provided with the voltage comparison circuit 10 or to change operation modes. Thus, immediately after a level change in the signal $CMP_{OUT}$, comparatively large noise may appear in the input signal to the comparator CMP. The voltage comparison circuit 10 yields a stable output despite noise. This will now be described with reference to FIG. 3 etc. For the sake of convenience, a virtual voltage comparison circuit, which is a circuit resulting from omitting the capacitor C11 from the voltage comparison circuit 10, will be taken up. The virtual voltage comparison circuit corresponds to the voltage comparison circuit 900 in FIG. 16.

Figure 3:
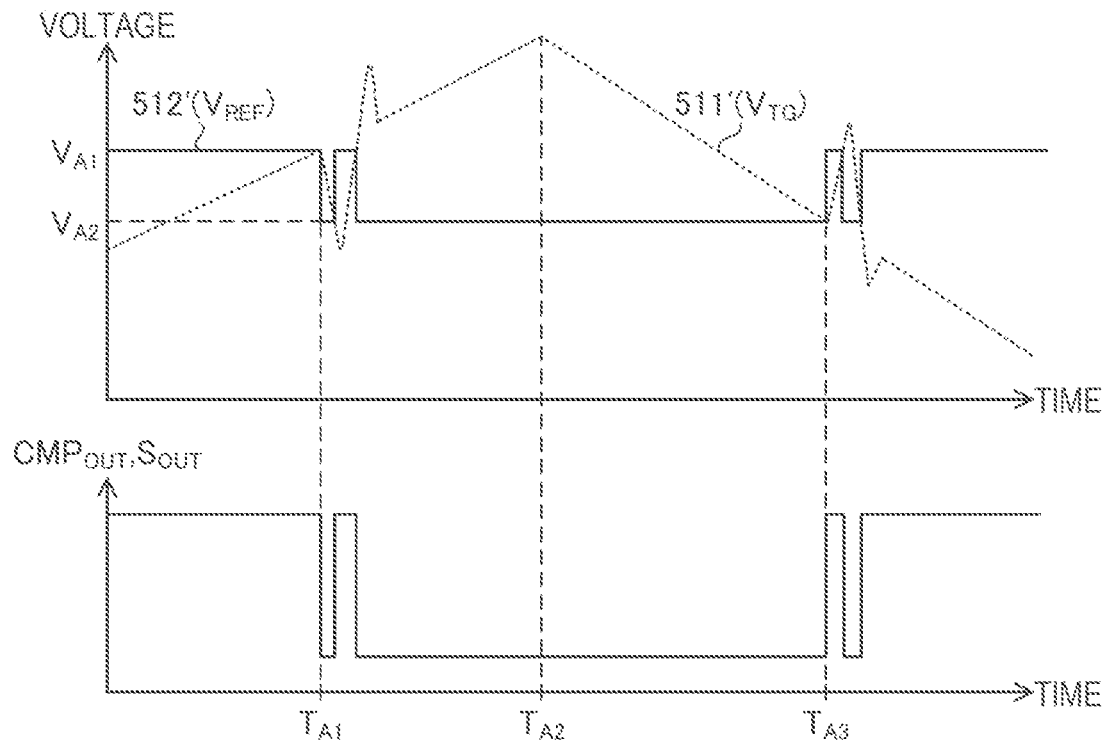
FIG. 3 is a timing chart of a virtual voltage comparison circuit.

FIG. 3 is a timing chart of the virtual voltage comparison circuit. In FIG. 3, a broken-line plot 511' represents the waveform of the target voltage $V_{TG}$ in which noise is present. A solid-line plot 512' represents the waveform of the reference voltage $V_{REF}$ in the virtual voltage comparison circuit. In the virtual voltage comparison circuit, at time point $T_{A1}$, the reference voltage $V_{REF}$ switches from the voltage $V_{A1}$ to the voltage $V_{A2}$, and in FIG. 3, immediately after the switch, due to noise, the target voltage $V_{TG}$ fluctuates to describe spikes between a voltage lower than the voltage $V_{A2}$ and a voltage higher than the voltage $V_{A1}$. As a result, in the virtual voltage comparison circuit associated with FIG. 3, immediately after time point $T_{A1}$, the levels of the signals $CMP_{OUT}$ and $S_{OUT}$ change repeatedly and unstably between high and low levels (i.e., level changes occur that are not expected to occur). Also immediately after time point $T_{A3}$, similar behavior is observed.

Increasing the difference between the voltages $V_{A1}$ and $V_{A2}$ leads to lower susceptibility to noise. However, increasing the difference between voltages $V_{A1}$ and $V_{A2}$, that is, increasing the hysteresis width, makes the voltage comparison circuit difficult to use.

Figure 4:
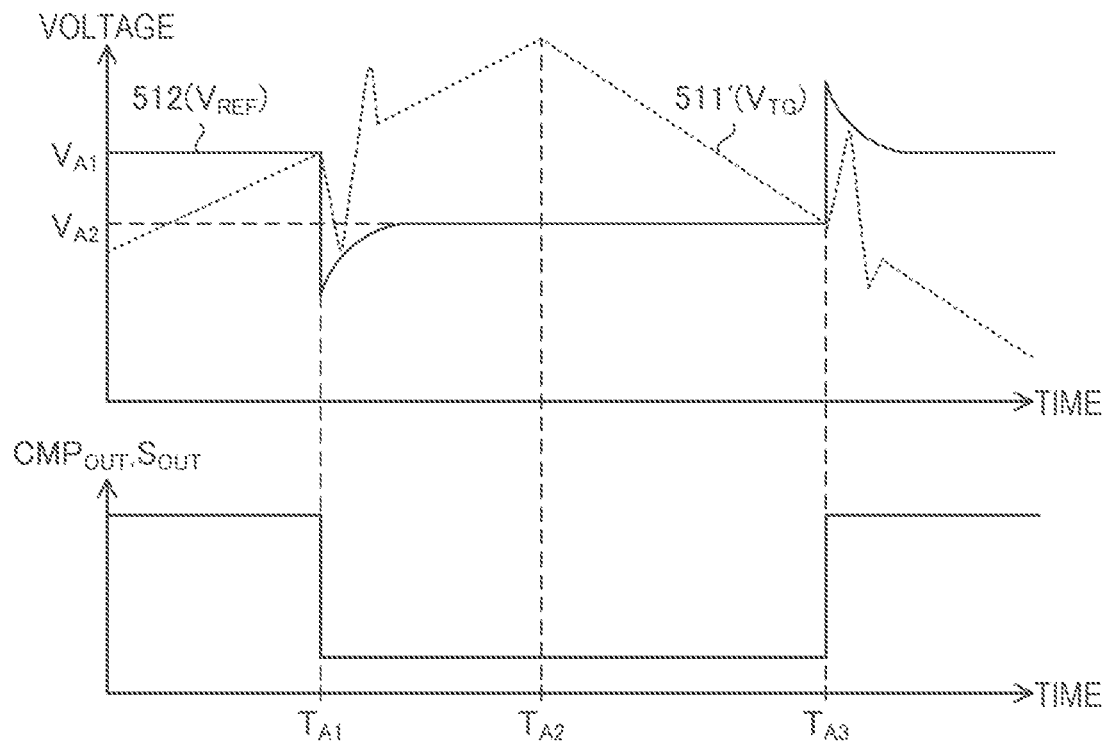
FIG. 4 is another timing chart of the voltage comparison circuit according to the first embodiment of the present invention.

FIG. 4 is a timing chart of the voltage comparison circuit 10 where noise is given consideration. In FIG. 4, a broken-line plot 511' represents the waveform of the target voltage $V_{TG}$ in which noise is present. The solid-line waveform 512 in FIG. 4 is the waveform of the reference voltage $V_{REF}$ in the voltage comparison circuit 10, and is the same as the waveform 512 in FIG. 2.

In the voltage comparison circuit 10, when, at time point $T_{A1}$, a shift from the state $V_{TG} < V_{REF}$ to the state $V_{TG} > V_{REF}$ takes place and as a result the level of live output signal $CMP_{OUT}$ of the comparator CMP changes, the high-pass filter including the capacitor C11 so functions that the level of the reference voltage $V_{REF}$ is momentarily lower than the voltage $V_{A2}$. Thus, immediately after time point $T_{A1}$, no unstable changes like those seen in FIG. 3 occur in the signals $CMP_{OUT}$ and $S_{OUT}$. The same is true immediately after time point $T_{A3}$.

As described above, the voltage comparison circuit 10 operates as if with a momentarily larger hysteresis width only immediately after a change in the output of the comparator CMP, and thus operates stably despite noise and the like.

Second Embodiment

Figure 5:
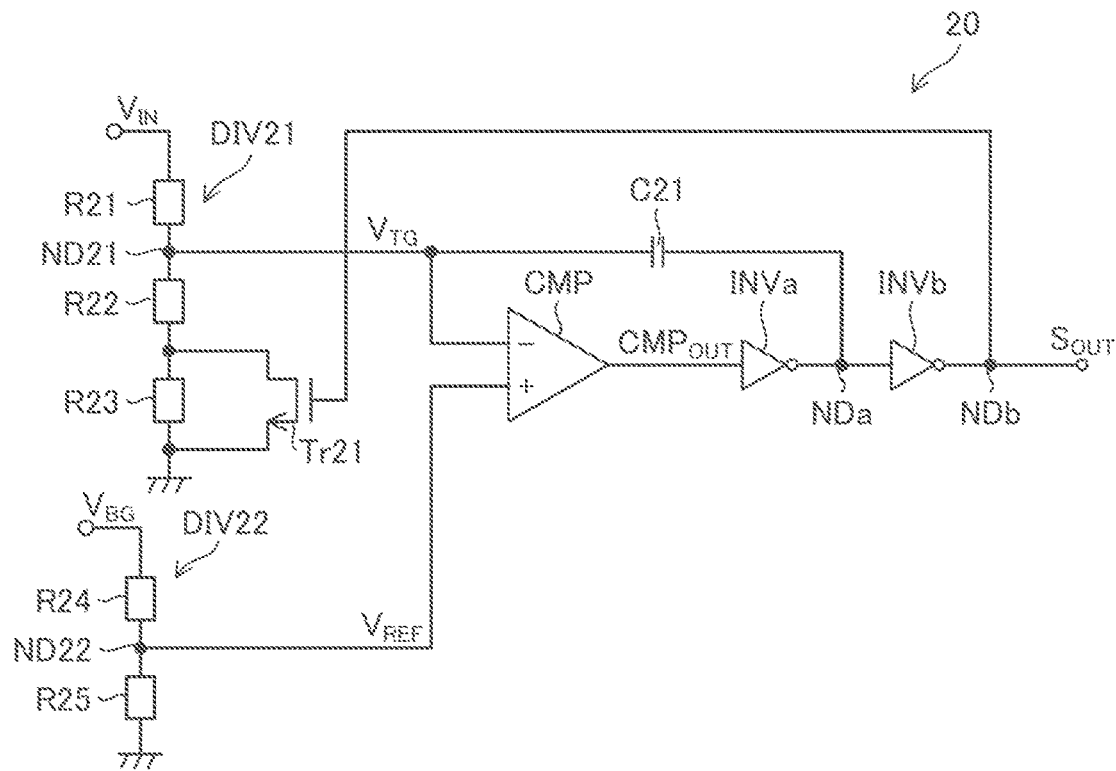
FIG. 5 is a circuit diagram of a voltage comparison circuit according to a second embodiment of the present invention.

A second embodiment of the present invention will be described. In the first embodiment (FIG. 1), the function of producing direct-current hysteresis (hereinafter referred to as DC hysteresis function for the sake of convenience) and the function of feeding changes in the output of the comparator CMP back to the input of the comparator CMP via a capacitor (hereinafter referred to as AC hysteresis function for the sake of convenience) are both provided on the reference voltage $V_{REF}$ side. Instead, the IX hysteresis function and the AC hysteresis function can Ire provided on the target voltage $V_{TG}$ side. This will now be described. FIG. 5 is a circuit diagram of a voltage comparison circuit 20 according to the second embodiment of the present invention. The voltage comparison circuit 20 includes a comparator CMP, inverters INVa and INVb, a capacitor C21, a transistor Tr21, and resistors R21 to R25 as voltage division resistors.

The resistors R21 to R23 constitute a voltage division circuit DIV21 that divides an input voltage $V_{IN}$ to generate a target voltage $V_{TG}$. The resistors R21 to R23 are connected in series with each other, and the input voltage $V_{IN}$ is applied across the series circuit of the resistors R21 to R23. The input voltage $V_{IN}$ is the voltage to be compared with a reference voltage $V_{REF}$ in the voltage comparison circuit 20. In practice, however, the target voltage $V_{TG}$, which is a division voltage of the input voltage $V_{IN}$, is compared with the reference voltage $V_{REF}$ by the comparator CMP. Specifically, one terminal of the resistor R21 is fed with the potential of the input voltage $V_{IN}$, the other terminal of the resistor R21 and one terminal of the resistor R22 are connected together at a node ND21, the other terminal of the resistor R22 is connected to one terminal of the resistor R23, and the other terminal of the resistor R23 is connected to the ground. The voltage that appears at the node ND21 serves as the target voltage $V_{TG\_A2}$ in the voltage comparison circuit 20.

The resistors R24 and R25 constitute a voltage division circuit DIV22 that divides a predetermined voltage $V_{BG}$ to generate the reference voltage $V_{REF}$. The resistors R24 and R25 are connected in series with each other, and the predetermined voltage $V_{BG}$ is applied across the series circuit of the resistors R24 and R25. Specifically, one terminal of the resistor R24 is fed with the potential of the predetermined voltage $V_{BG}$, and the other terminal of the resistor R24 is connected via the resistor R25 to the ground. The voltage that appears at the connection node ND22 between the resistors R24 and R25 serves as the reference voltage $V_{REF}$ in the voltage comparison circuit 20.

In the voltage comparison circuit 20, the nodes ND21 and ND22 are connected to the inverting input terminal and the non-inverting input terminal, respectively, of the comparator CMP, so that the inverting input terminal and the non-inverting input terminal of the comparator CMP are fed with the target voltage $V_{TG}$ and the reference voltage $V_{REF}$ respectively.

The configuration and the operation of the comparator CMP and the Inverters INVa and INVb and their interconnection in the voltage comparison circuit 20 are the same as in the voltage comparison circuit 10 of the first embodiment. In the voltage comparison circuit 20, the output signal of the inverter INVb appears at the output terminal of the voltage comparison circuit 20, and serves as the output signal $S_{OUT}$ of the voltage comparison circuit 20.

The transistor Tr21 is a switching element that is connected in parallel with the resistor R23 to open or short-circuit across the resistor R23. Here, the transistor Tr21 is assumed to be configured as an N-channel MOSFET, with the drain of the transistor Tr21 connected to the connection node between the resistors R22 and R23, the source of the transistor Tr21 connected to the ground, and the gate of the transistor Tr21 connected to the node NDb.

When the signal at the node NDb (i.e., the output signal of the inverter INVb) is at low level, the transistor Tr21 is off to open across the resistor R23. When the signal at the node NDb (i.e., the output signal of the inverter INVb) is at high level, the transistor Tr21 is on to short-circuit across the resistor R23. Thus, when the resistance values of the resistors R21, R22, and R23 are represented by the symbols R21, R22, and R23 respectively, with the transistor Tr21 off, $V_{TG}=V_{B1}=V_{IN}\times(R22+R23)/(R21+R22+R23)$ and, with the transistor Tr21 on, $V_{TG}=V_{B2}=V_{IN}/R22/(R21+R22)$. Naturally, the relationship $V_{B1}>V_{B2}$ holds. Thus, the resistors R21 to R23 constitute the voltage division circuit DIV21 that divides the input voltage $V_{IN}$ to generate the target voltage $V_{TG}$, and the voltage division ratio here changes in accordance with the signal at the node NDb (and hence the output signal of the comparator CMP); this gives the comparator CMP hysteresis.

In the voltage comparison circuit 20, the capacitor C21 is inserted between the node NDa, which is fed with the output signal of the inverter INVa, and the non-inverting input terminal of the comparator CMP. That is, one terminal of the capacitor C21 is connected to the node NDa, and the other terminal of the capacitor C21 is connected to the inverting input terminal of the comparator CMP. As mentioned above, the connection node ND21 between the resistors R21 and R22 also is connected to the inverting input terminal of the comparator CMP. Thus, the resistors R21 to R23 and the capacitor C21 together constitute a high-pass filter that delivers the alternating-current component of the signal at the node NDa to the node ND21 and to the inverting input terminal of the comparator CMP. Accordingly, when the level of the signal $CMP_{OUT}$ changes between low and high levels, an alternating-current signal based on the change is delivered from the node NDa via the capacitor C21 to the node ND21 and to the inverting input terminal of the comparator CMP, with the result that the alternating-current signal is superposed on the target voltage $V_{TG}$. For example, the serial composite resistance value of the resistors R21 to R23 is several megohms, and the capacitance value of live capacitor C21 is from 1 pF (picofarad) to several picofarads.

Figure 6:
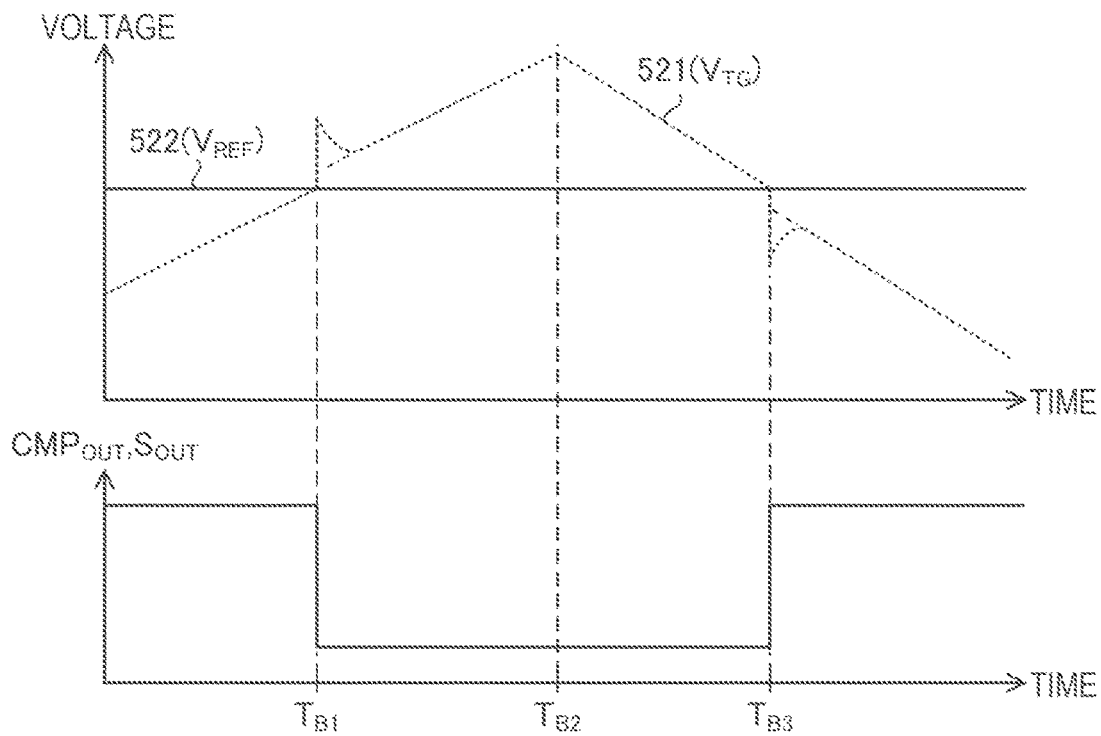
FIG. 6 is a liming chart of the voltage comparison circuit according to the second embodiment of the present invention.

FIG. 6 a timing chart of the voltage comparison circuit 20. In FIG. 6, a partly curved broken-line waveform 521 is the waveform of the target voltage $V_{TG}$, and a solid line segment 522 represents the waveform of the reference voltage $V_{REF}$. In the example of FIG. 6, before time point $T_{B1}$, $V_{TG}<V_{REF}$ all the time, and accordingly the output signals $CMP_{OUT}$ and $S_{OUT}$ remain at high level. Thus, before time point $T_{B1}$, the transistor Tr21 is on, and thus $V_{TG}=V_{B2}$.

In the example of FIG. 6, from a time point before time point $T_{B1}$ to time point $T_{B2}$, the input voltage $V_{IN}$ increases monotonically, and at time point $T_{B1}$, a shift from the state $V_{TG}<V_{REF}$ to the state $V_{TG}>V_{REF}$ takes place. Thus, at time point $T_{B1}$, the output signals $CMP_{OUT}$ and $S_{OUT}$ switch from high level to low level. In response to the output signal $CMP_{OUT}$ switching from high level to low level, the transistor Tr21 turns off, and at time point $T_{B1}$, a switch from the state $V_{TG}=V_{B2}$ to the state $V_{TG}=V_{B1}$ takes place (as mentioned above, $V_{B1}>V_{B2}$). It should be noted that the switch here is a switch in the direct-current component of the target voltage $V_{TG}$. More specifically, at time point $T_{B1}$, a switch from the state where the direct-current component of the target voltage $V_{TG}$, equals the voltage $V_{B2}$ to the state where it equals the voltage $V_{B1}$ takes place.

On the other hand, as a result of the output signal $CMP_{OUT}$ switching from high level to low level and accordingly the output signal of the inverter INVa switching from low level to high level, a current momentarily passes through the above-mentioned high-pass filter that includes the capacitor C21. Thus, starting at time point $T_{B1}$, the target voltage $V_{TG}$ is momentarily higher than the voltage $V_{B1}$ for the period in which that current passes, by the amount of voltage proportional to that current.

In the example of FIG. 6, from time point $T_{B2}$ via time point $T_{B3}$ to a time point after time point $T_{B3}$, the input voltage $V_{IN}$ decreases monotonically, and at time point $T_{B3}$, a shift from the state $V_{TG}>V_{REF}$ to the state $V_{TG}<V_{REF}$ takes place. Thus, at time point $T_{B3}$, the output signals $CMP_{OUT}$ and $S_{OUT}$ switch from low level to high level. In response to the switch, the transistor Tr21 turns on, and at time point $T_{B3}$, a switch from the state $V_{TG}=V_{B1}$ to the state $V_{TG}=V_{B2}$ takes place. It should be noted that the switch here is a switch in the direct-current component of the target voltage $V_{TG}$. More specifically, at time point $T_{B3}$, a switch from the state where the direct-current component of the target voltage $V_{TG}$ equals the voltage $V_{B1}$ to the state where it equals the voltage $V_{B2}$ takes place.

On the other hand, as a result of the output signal $CMP_{OUT}$ switching from low level to high level and accordingly the output signal of the inverter INVa switching from high level to low level, a current momentarily passes through the above-mentioned high-pass filter that includes the capacitor C21. Thus, starting at time point $T_{B3}$, the target voltage $V_{TG}$ is momentarily lower than the voltage $V_{B2}$ for the period in which that current passes, by the amount of voltage proportional to that current.

In FIG. 6, it is assumed that no noise is present in the input signal to the comparator CMP. In practice, noise can be present in the input signal to the comparator CMP. Even then, like the voltage comparison circuit 10 of the first embodiment, the voltage comparison circuit 20 operates as if with a momentarily larger hysteresis width only immediately after a change in the output of the comparator CMP, and thus operates stably despite noise and the like.

Third Embodiment

Figure 7:
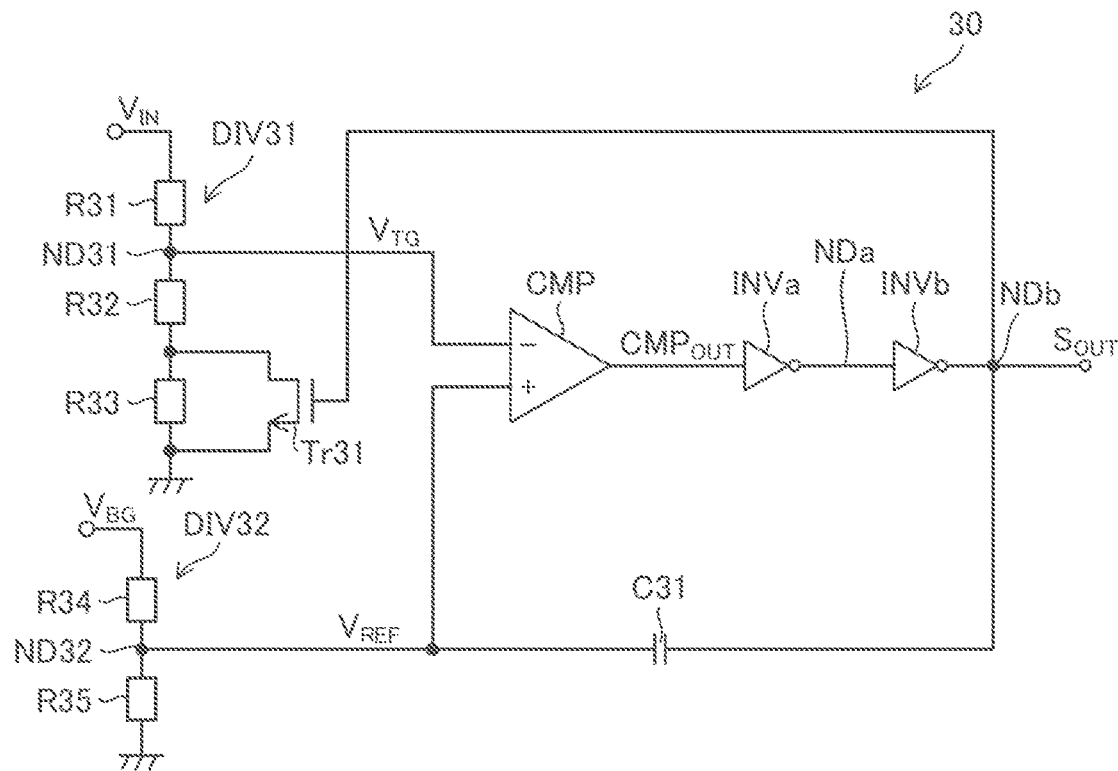
FIG. 7 is a circuit diagram of a voltage comparison circuit according to a third embodiment of the present invention.

A third embodiment of the present invention will be described, it is also possible to provide the DC hysteresis function on the target voltage $V_{TG}$ side and the AC hysteresis function on the reference voltage $V_{REF}$ side. This will now be described. FIG. 7 is a circuit diagram of a voltage comparison circuit 30 according to the third embodiment of the present invention. The voltage comparison circuit 30 includes a comparator CMP, inverters INVa and INVb, a capacitor C31, a transistor Tr31, and resistors R31 to R35 as voltage division resistors.

The resistors resistor R31 to resistor R33 constitute a voltage division circuit DIV31 that divides an input voltage $V_{IN}$ to generate a target voltage $V_{TG}$. The resistors resistor R31 to R33 are connected in series with each other, and the input voltage $V_{IN}$ is applied across the series circuit of the resistors resistor R31 to R33. The input voltage $V_{IN}$ is the voltage to be compared with the reference voltage $V_{REF}$ in the voltage comparison circuit 30. In practice, however, the target voltage $V_{TG}$, which is a division voltage of the input voltage $V_{IN}$, is compared with the reference voltage $V_{REF}$ by the comparator CMP. Specifically, one terminal of the resistor R31 is fed with the potential of the input voltage $V_{IN}$, the other terminal of the resistor R31 and one terminal of the resistor R32 are connected together at a node ND31, the other terminal of the resistor R32 is connected to one terminal of the resistor R33, and the other terminal of the resistor R33 is connected to a ground. The voltage that appears at the node ND31 serves as the target voltage $V_{TG}$ in the voltage comparison circuit 30.

The resistors R34 and R35 constitute a voltage division circuit DIV32 that divides a predetermined voltage $V_{BG}$ to generate a reference voltage $V_{REF}$. The resistors R34 and R35 are connected in series with each other, and the predetermined voltage $V_{BG}$ is applied across the series circuit of the resistors R34 and R35. Specifically, one terminal of the resistor R34 is fed with the potential of the predetermined voltage $V_{BG}$, and the other terminal of the resistor R34 is connected via the resistor R35 to the ground. The voltage that appears at the connection node ND32 between the resistors R34 and R35 serves as the reference voltage $V_{REF}$ in the voltage comparison circuit 30.

In the voltage comparison circuit 30, the nodes ND31 and ND32 are connected to the inverting input terminal and the non-inverting input terminal, respectively, of the comparator CMP, so that the inverting input terminal and the non-inverting input terminal of the comparator CMP are fed with the target voltage $V_{TG}$ and the reference voltage $V_{REF}$ respectively.

The configuration and the operation of the comparator CMP and the inverters INVa and INVb and their interconnection in the voltage comparison circuit 30 are the same as in the voltage comparison circuit 10 of the first embodiment. In the voltage comparison circuit 30, the output signal of the inverter INVb appears at the output terminal of the voltage comparison circuit 30, and serves as the output signal $S_{OUT}$ of the voltage comparison circuit 30.

The transistor Tr31 is a switching element that is connected in parallel with the resistor R33 to open or short-circuit across the resistor R33. Here, the transistor Tr31 is assumed to be configured as an N-channel MOSFET, with the drain of the transistor Tr31 connected to the connection node between the resistors R32 and R33, the source of the transistor Tr31 connected to the ground, and the gate of the transistor Tr31 connected to a node NDb.

When the signal at the node NDb (i.e., the output signal of the inverter INVb) is at low level, the transistor Tr31 is off to open across the resistor R33. When the signal at the node NDb (i.e., the output signal of the inverter INVb) is at high level, the transistor Tr31 is on to short-circuit across the resistor R33. Thus, when the resistance values of the resistors R31, R32, and R33 are represented by the symbols R31, R32, and R33 respectively, with the transistor Tr31 off, $V_{TG}=V_{C1}=V_{IN}\times(R32+R33)/(R31+R32+R33)$ and, with the transistor Tr31 on, $V_{TG}=V_{C2}=V_{IN}\times R32/(R31+R32)$. Naturally, the relationship $V_{C1}>V_{C2}$ holds. Thus, the resistors R31 to R33 constitute the voltage division circuit DIV31 that divides the input voltage $V_{IN}$ to generate the target voltage $V_{TG}$, and the voltage division ratio here changes in accordance with the signal at the node NDb (and hence the output signal of the comparator CMP); this gives the comparator CMP hysteresis.

In the voltage comparison circuit 30, the capacitor C31 is inserted between the node NDb, which is fed with the output signal of the inverter INVb, and the non-inverting input terminal of the comparator CMP. That is, one terminal of the capacitor C31 is connected to the node NDb, and the other terminal of the capacitor C31 is connected to the non-inverting input terminal of the comparator CMP. As mentioned above, the connection node ND32 between the resistors R34 and R35 also is connected to the non-inverting input terminal of the comparator CMP. Thus, the resistors R34 and R35 and the capacitor C31 together constitute a high-pass filter that delivers the alternating-current component of the signal at the node NDb to the node ND32 and to the non-inverting input terminal of the comparator CMP. Accordingly, when the level of the signal $CMP_{OUT}$ changes between low and high levels, an alternating-current signal based on the change is delivered from the node NDb via the capacitor C31 to the node ND32 and to the non-inverting input terminal of the comparator CMP, with the result that the alternating-current signal is superposed on the reference voltage $V_{REF}$. For example, the serial composite resistance value of the resistors R31 to R33 is several megohms, and the capacitance value of the capacitor C31 is from 1 pF (picofarad) to several picofarads.

Figure 8:
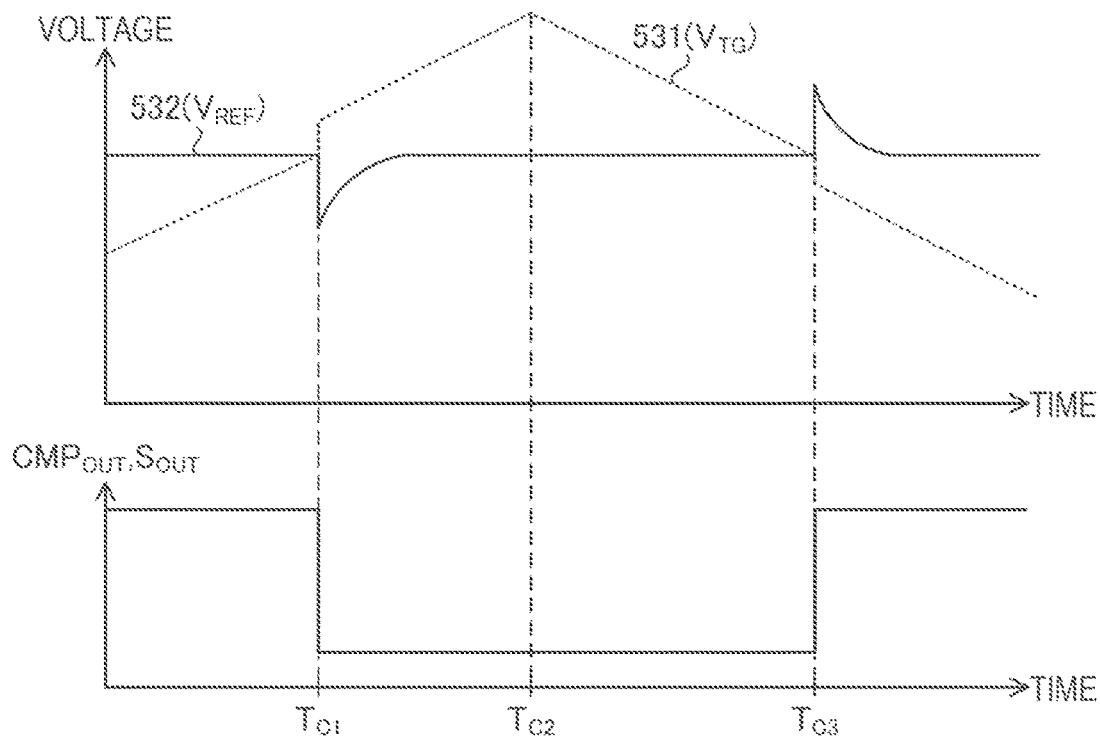
FIG. 8 is a timing chart of the voltage comparison circuit according to the third embodiment of the present invention.

FIG. 8 is a timing chart of the voltage comparison circuit 30. In FIG. 8, a broken-line plot 531 represents the waveform of the target voltage $V_{TG}$, and a partly curved solid-line waveform 532 is the waveform of the reference voltage $V_{REF}$. In the example of FIG. 8, before time point $T_{C1}$, $V_{TG}<V_{REF}$ all the time, and accordingly the output signals $CMP_{OUT}$ and $S_{OUT}$ remain at high level. Thus, before time point $T_{C1}$, the transistor Tr31 is on, and thus $V_{TG}=V_{C2}$.

In the example of FIG. 8, from a time point before time point $T_{C1}$ to time point $T_{C2}$, the input voltage $V_{IN}$ increases monotonically, and at time point $T_{C1}$, a shift from the state $V_{TG}<V_{REF}$ to the state $V_{TG}>V_{REF}$ takes place. Thus, at time point $T_{C1}$, the output signals $CMP_{OUT}$ and $S_{OUT}$ switch from high level to low level. In response to the output signal $S_{OUT}$ switching from high level to low level, the transistor Tr31 turns off, and at time point $T_{C1}$, a switch from the state $V_{TG}=V_{C2}$ to the state $V_{TG}=V_{C1}$ takes place (as mentioned above, $V_{C1}>V_{C2}$)

On the other hand, as a result of the output signal $S_{OUT}$ switching from high level to low level, a current momentarily passes through the above-mentioned high-pass filter that includes the capacitor C31. Thus, starting at time point $T_{C1}$, the reference voltage $V_{REF}$ is momentarily lower than the direct-current voltage $(V_{BG} \times R35/(R34+R35))$ determined by the values of the predetermined voltage $V_{BG}$ and of the resistors R34 and R35 for the period in which that current passes, by the amount of voltage proportional to that current.

In the example of FIG. 8, from time point $T_{C2}$ via time point $T_{C3}$ to a time point after time point $T_{C3}$, the input voltage $V_{IN}$ decreases monotonically, and at time point $T_{C3}$, a shift from the state $V_{TG}>V_{REF}$ to the state $V_{TG}<V_{REF}$ takes place. Thus, at time point $T_{C3}$, the output signals $CMP_{OUT}$ and $S_{OUT}$ switch from low level to high level. In response to the switch, the transistor Tr31 turns on, and at time point $T_{C3}$, a switch from the state $V_{TG}=V_{C1}$ to the state $V_{TG}=V_{C2}$ takes place.

On the other hand, as a result of the output signal $S_{OUT}$ switching from low level to high level, a current momentarily passes through the above-mentioned high-pass filter that includes the capacitor C31. Thus, starting at time point $T_{C3}$, the reference voltage $V_{REF}$ is momentarily higher than the direct-current voltage $(V_{BG} \times R35/(R34+R35))$ determined by the values of the predetermined voltage $V_{BG}$ and of the resistors R34 and R35 for the period in which that current passes, by the amount of voltage proportional to that current.

In FIG. 8, it is assumed that no noise is present in the input signal to the comparator CMP. In practice, noise can be present in the input signal to the comparator CMP. Even then, like the voltage comparison circuit 10 of the first embodiment, the voltage comparison circuit 30 operates as if with a momentarily larger hysteresis width only immediately after a change in the output of the comparator CMP, and thus operates stably despite noise and the like.

Fourth Embodiment

Figure 9:
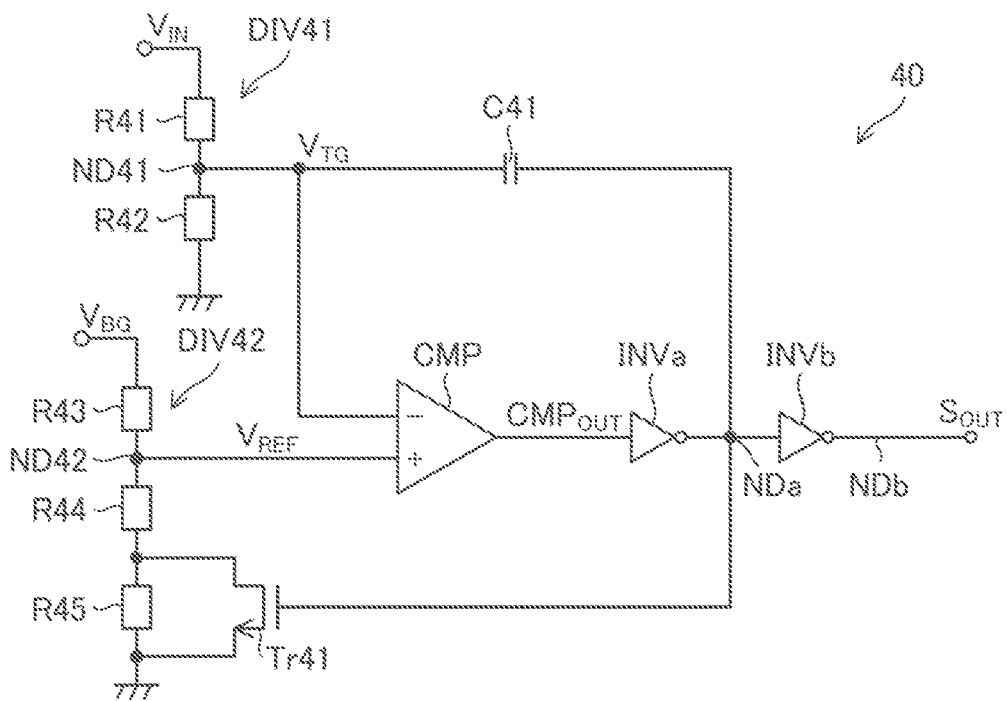
FIG. 9 is a circuit diagram of a voltage comparison circuit according to a fourth embodiment of the present invention.

A fourth embodiment of the present invention will be described. It is also possible to provide the DC hysteresis function on the reference voltage $V_{REF}$ side and the AC hysteresis function on the target voltage $V_{TG}$ side. This will now be described. FIG. 9 is a circuit diagram of a voltage comparison circuit 40 according to the fourth embodiment of the present invention. The voltage comparison circuit 40 includes a comparator CMP, inverters INVa and INVb, a capacitor C41, a transistor Tr41, and resistors R41 to R45 as voltage division resistors.

The resistors resistor R41 and R42 constitute a voltage division circuit DIV41 that divides an input voltage $V_{IN}$ to generate a target voltage $V_{TG}$. The resistors resistor R41 and R42 are connected in series with each other, and the input voltage $V_{IN}$ is applied across the series circuit of the resistors R41 and R42. Specifically, one terminal of the resistor R41 is fed with the potential of the input voltage $V_{IN}$, and the other terminal of the resistor R41 is connected via the resistor R42 to a ground. The voltage that appears at the connection node ND41 between the resistors R41 and R42 serves as the target voltage $V_{TG}$ in the voltage comparison circuit 40.

The resistors R43 to R45 constitute a voltage division circuit DIV42 that divides a predetermined voltage $V_{BG}$ to generate a reference voltage $V_{REF}$. The resistors R43 to R45 are connected in series with each other, and the predetermined voltage $V_{BG}$ is applied across the series circuit of the resistors R43 to R45. Specifically, one terminal of the resistor R43 is fed with the potential of the predetermined voltage $V_{BG}$, the other terminal of the resistor R43 and one terminal of the resistor R44 are connected together at a node ND42, the other terminal of the resistor R44 is connected to one terminal of the resistor R45, and the other terminal of the resistor R45 is connected to the ground. The voltage that appears at the connection node ND42 serves as the reference voltage $V_{REF}$ in the voltage comparison circuit 40.

In the voltage comparison circuit 40, the nodes ND41 and ND42 are connected to the inverting input terminal and the non-inverting input terminal, respectively, of the comparator CMP, so that the inverting input terminal and the non-inverting input terminal of the comparator CMP are fed with the target voltage $V_{TG}$ and the reference voltage $V_{REF}$ respectively.

The configuration and the operation of the comparator CMP and the inverters INVa and INVb and their interconnection in the voltage comparison circuit 40 are the same as in the voltage comparison circuit 10 of the first embodiment. In the voltage comparison circuit 40, the output signal of the inverter INVb appears at the output terminal of the voltage comparison circuit 40, and serves as the output signal $S_{OUT}$ of the voltage comparison circuit 40.

The transistor Tr41 is a switching element that is connected in parallel with the resistor R45 to open or short-circuit across the resistor R45. Here, the transistor Tr41 is assumed to be configured as an N-channel MOSFET, with the drain of the transistor Tr41 connected to the connection node between the resistors R44 and R45, the source of the transistor Tr41 connected to the ground, and the gate of the transistor Tr41 connected to a node NDa.

When the signal at the node NDa (i.e., the output signal of the inverter INVa) is at low level, the transistor Tr41 is off to open across the resistor R45. When the signal at the node NDa (i.e., the output signal of the inverter INVa) is at high level, the transistor Tr41 is on to short-circuit across the resistor R45. Thus, when the resistance values of the resistors R43, R44, and R45 are represented by the symbols R43, R44, and R45 respectively, with the transistor Tr41 off, $V_{REF}=V_{D1}=V_{BG}/(R44+R45)/(R43+R44+R45)$ and, with the transistor Tr41 is on, $V_{REF}=V_{D2}=V_{BG} \times R44/(R43+R44)$. The voltages $V_{D1}$ and $V_{D2}$ are identified in FIG. 10, and naturally the relationship $V_{D1}>V_{D2}$ holds Thus, the resistors R43 to R45 constitute the voltage division circuit DIV42 that divides the predetermined voltage $V_{BG}$ to generate the reference voltage $V_{REF}$, and the voltage division ratio here changes in accordance with the signal at the node NDa (and hence the output signal of the comparator CMP); this gives the comparator CMP hysteresis.

In the voltage comparison circuit 40, the capacitor C41 is inserted between the node NDa, which is fed with the output signal of the inverter INVa, and the inverting input terminal of the comparator CMP. That is, one terminal of the capacitor C41 is connected to the node NDa, and the other terminal of the capacitor C41 is connected to the inverting input terminal of the comparator CMP. As mentioned above, the connection node ND41 between the resistors R41 and R42 also is connected to the inverting input terminal of the comparator CMP. Thus, the resistors R41 and R42 and the capacitor C41 together constitute a high-pass filter that delivers the alternating-current component of the signal at the node NDa to the node ND41 and to the inverting input terminal of the comparator CMP. Accordingly, when the level of the signal $CMP_{OUT}$ changes between low and high levels, an alternating-current signal based on the change is delivered from the node NDa via the capacitor C41 to the node ND41 and to the inverting input terminal of the comparator CMP, with the result that the alternating-current signal is superposed on the target voltage $V_{TG}$. For example, the serial composite resistance value of the resistors R41 and R42 is several megohms, and the capacitance value of the capacitor C41 is from 1 pF (picofarad) to several picofarads.

Figure 10:
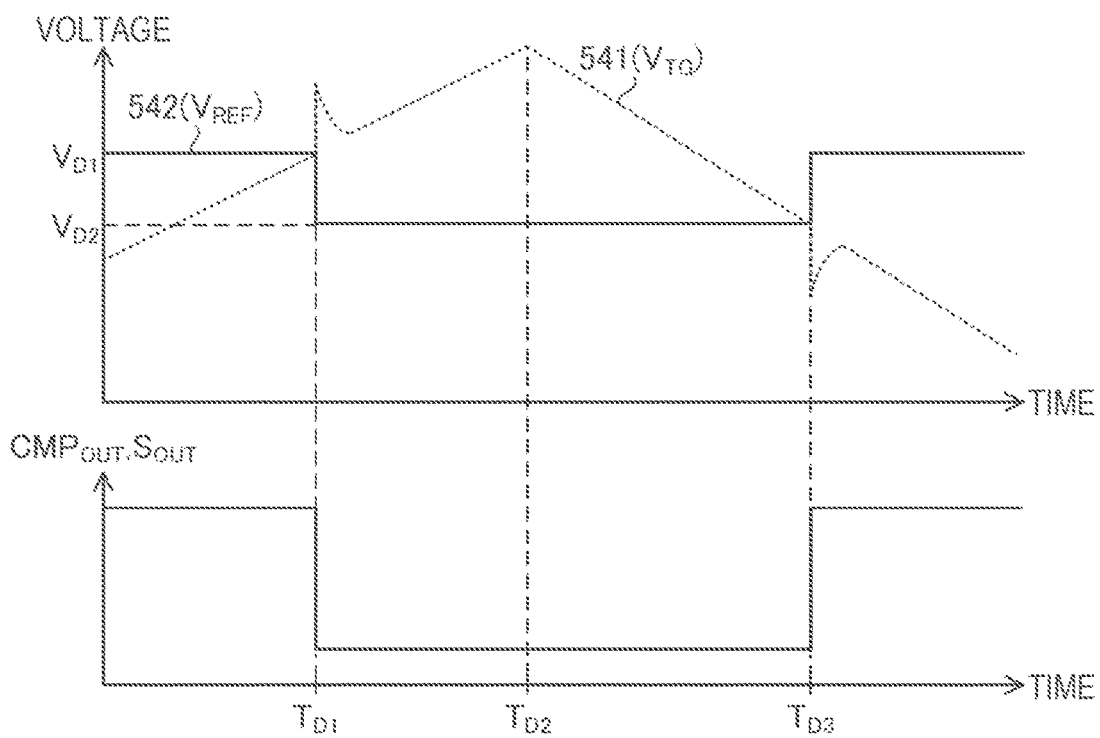
FIG. 10 is a timing chart of the voltage comparison circuit according to the fourth embodiment of the present invention.

FIG. 10 is a timing chart of the voltage comparison circuit 40. In FIG. 10, a partly curved broken-line waveform 541 is the waveform of the target voltage $V_{TG}$, and a solid-line plot 542 represents the waveform of the reference voltage $V_{REF}$. Before time point $T_{D1}$, $V_{TG} < V_{REF}$ all the time, and accordingly the output signals $CMP_{OUT}$ and $S_{OUT}$ remain at high level. Thus, before time point $T_{D1}$, the transistor Tr41 is off, and thus $V_{REF} = V_{D1}$.

In the example of FIG. 10, from a time point before time point $T_{D1}$ to time point $T_{D2}$, the target voltage $V_{TG}$ increases monotonically, and at time point $T_{D1}$, a shift from the state $V_{TG} < V_{D1}$ to the state $V_{TG} > V_{D1}$ takes place. Thus, at time point $T_{D1}$, the output signals $CMP_{OUT}$ and $S_{OUT}$ switch front high level to low level. In response to the output signal $CMP_{OUT}$ switching from high level to low level, the signal at the node NDa switches from low level to high level; thus the transistor Tr41 turns on, and at time point $T_{D1}$, a switch from the state $V_{REF} = V_{D1}$ to the state $V_{REF} = V_{D2}$ takes place.

On the other hand, as a result of the output signal $CMP_{OUT}$ switching from high level to low level and accordingly the output signal of the inverter INVa switching from low level to high level, a current momentarily passes through the above-mentioned high-pass filter that includes the capacitor C41. Thus, starting at time point $T_{D1}$, the target voltage $V_{TG}$ is momentarily higher than the voltage ($V_{IN} \times$ R42/(R41+R42)) determined by the values of the input voltage $V_{IN}$ and of the resistors R41 and R42 for the period in which that current passes, by the amount of voltage proportional to that current.

In the example of FIG. 10, from time point $T_{D2}$ via time point $T_{D3}$ to a time point after time point $T_{D3}$, the target voltage $V_{TG}$ decreases monotonically, and at time point $T_{D3}$, a shift from the state $V_{TG} > V_{D2}$ to the state $V_{TG} < V_{D2}$ takes place. Thus, at time point $T_{D3}$, the output signals $CMP_{OUT}$ and $S_{OUT}$ switch from low level to high level. In response to the signal $CMP_{OUT}$ switching from low level to high level, the signal at the node NDa switches from high level to low level; thus, the transistor Tr41 turns off, and at time point $T_{D3}$, a switch from the state $V_{REF} = V_{D2}$ to the state $V_{REF} = V_{D1}$ takes place.

On the other hand, as a result of the output signal $CMP_{OUT}$ switching from low level to high level and accordingly the output signal of the inverter INVa switching from high level to low level, a current momentarily passes through the above-mentioned high-pass Filter that includes the capacitor C41. Thus, starting at time point $T_{D3}$, the target voltage $V_{TG}$ is momentarily lower than the voltage ($V_{IN} \times$ R42/(R41+R42)) determined by the values of the input voltage $V_{IN}$ and of the resistors R41 and R42 for the period in which that current passes, by the amount of voltage proportional to that current.

In FIG. 10, it is assumed that no noise is present in the input signal to the comparator CMP. In practice, noise can be present in the input signal to the comparator CMP. Even then, like the voltage comparison circuit 10 of the first embodiment, the voltage comparison circuit 40 operates as if with a momentarily larger hysteresis width only immediately after a change in the output of the comparator CMP, and thus operates stably despite noise and the like.

Fifth Embodiment

Figure 11:
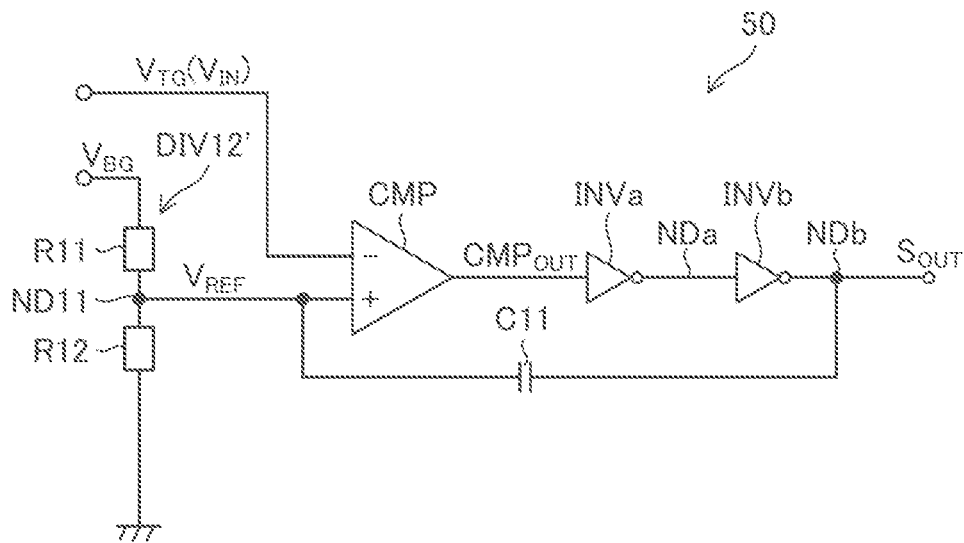
FIG. 11 is a circuit diagram of a voltage comparison circuit according to a fifth embodiment of the present invention.

A fifth embodiment of the present invention will be described. It is also possible to omit the DC hysteresis function and provide the AC hysteresis function alone on the reference voltage $V_{REF}$ side. This will now be described. FIG. 11 is a circuit diagram of a voltage comparison circuit 50 according to the fifth embodiment of the present invention. The voltage comparison circuit 50 results from modifying part of the voltage comparison circuit 10 in FIG. 1. Specifically, modifying the voltage comparison circuit 10 in FIG. 1 by omitting the transistor Tr11 and the resistor R13 results in the voltage comparison circuit 50, and except for these omissions, the configuration and the operation of the voltage comparison circuit 50 are the same as those of the voltage comparison circuit 10.

As a result of the resistor R13 being omitted, the voltage division circuit DIV12' in the voltage comparison circuit 50 is constituted by the series circuit of the resistors R11 and R12, and divides the predetermined voltage $V_{BG}$ to generate the reference voltage $V_{REF}$. Specifically, in the voltage comparison circuit 50, one terminal of the resistor R11 is fed with the potential of the predetermined voltage $V_{BG}$, the other terminal of the resistor R11 and one terminal of the resistor R12 are connected together at the node ND11, and the other terminal of the resistor R12 is connected to the ground. In the voltage comparison circuit 50, the voltage that appears at the node ND11 serves as the reference voltage $V_{REF}$, and the node ND11 is connected to the non-inverting input terminal of the comparator CMP.

Figure 12:
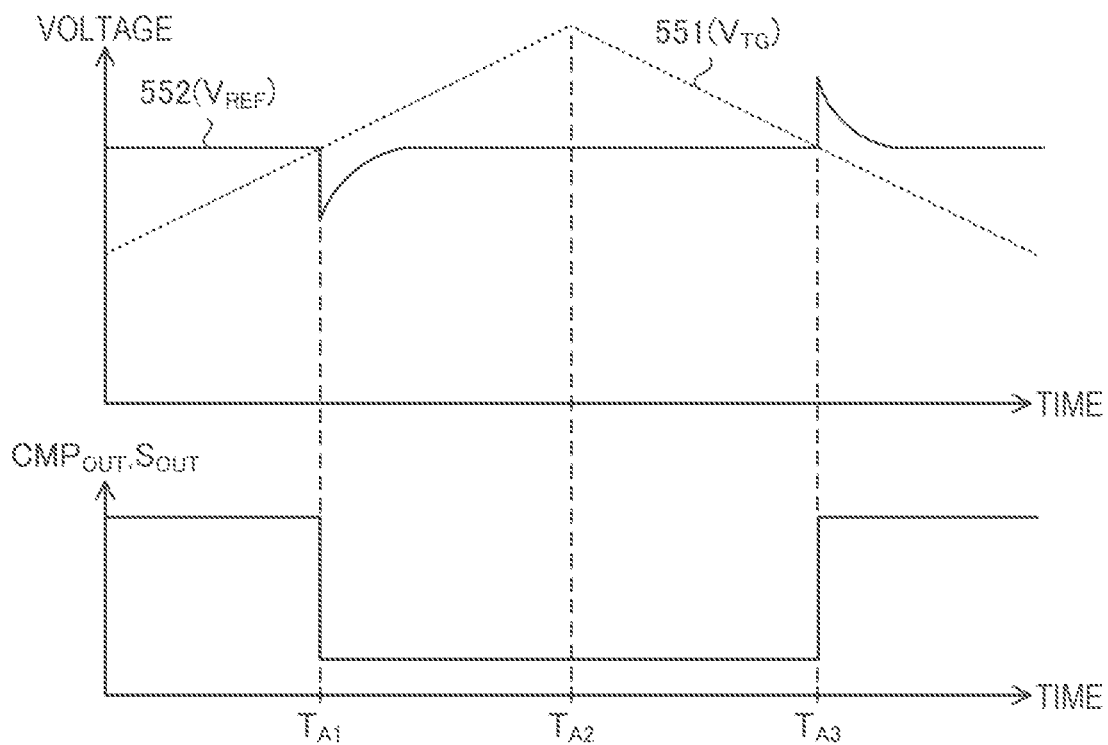
FIG. 12 is a timing chart of the voltage comparison circuit according to the fifth embodiment of the present invention.

FIG. 12 is a timing chart of the voltage comparison circuit 50. In FIG. 12, a broken-line plot 551 represents the waveform of the target voltage $V_{TG}$, and a partly curved solid-line waveform 552 is the waveform of the reference voltage $V_{REF}$. The timing chart in FIG. 12 corresponds to assuming that $V_{A1} = V_{A2}$ in the timing chart in FIG. 2. As a result of the transistor Tr11 and the resistor R13 in FIG. 1 being omitted, the voltage comparison circuit 50 does not offer the DC hysteresis function hut offers the AC hysteresis function, as the voltage comparison circuit 10 does, owing to the capacitor C11 being inserted between the nodes NDb and ND11.

Sixth Embodiment

Figure 13:
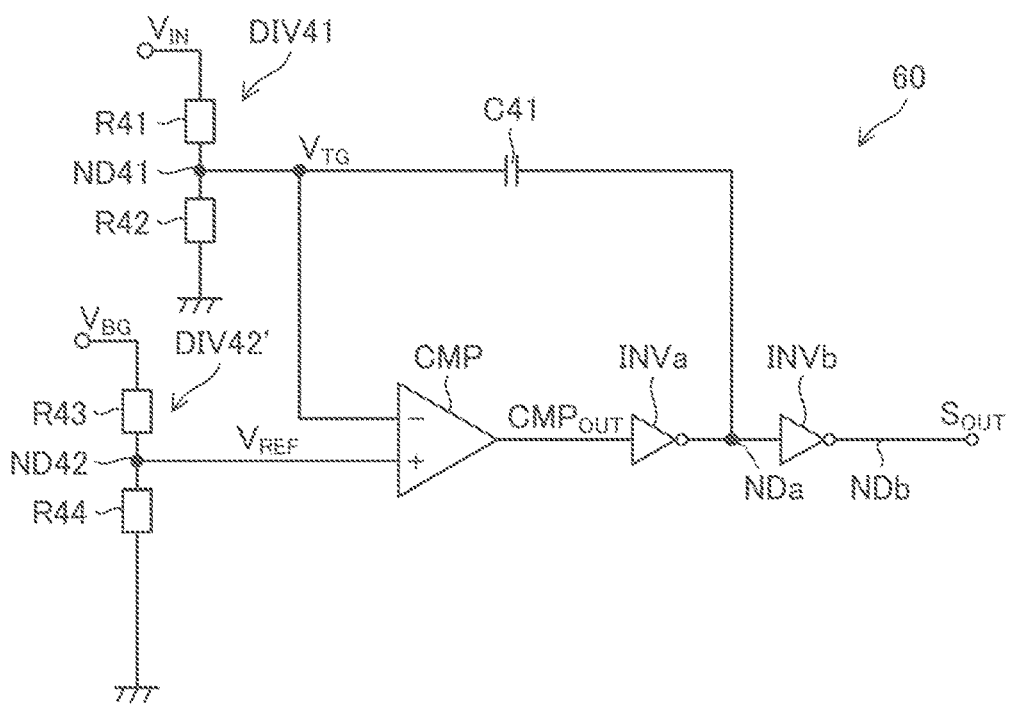
FIG. 13 is a circuit diagram of a voltage comparison circuit according to a sixth embodiment of the present invention.

A sixth embodiment of the present invention will be described. It is also possible to omit the DC hysteresis function and provide the AC hysteresis function alone on the target voltage $V_{TG}$ side. This will now be described. FIG. 13 is a circuit diagram of a voltage comparison circuit 60 according to the sixth embodiment of the present invention. The voltage comparison circuit 60 results from modifying part of the voltage comparison circuit 40 in FIG. 9. Specifically, modifying the voltage comparison circuit 40 in FIG. 9 by omitting the transistor Tr41 and the resistor R45 results in the voltage comparison circuit 60, and except for these omissions, the configuration and the operation of the voltage comparison circuit 60 are the same as those of the voltage comparison circuit 40.

As a result of the resistor R45 being omitted, the voltage division circuit DIV42' in the voltage comparison circuit 60 is constituted by the series circuit of the resistors R43 and R44, and divides the predetermined voltage $V_{BG}$ to generate the reference voltage $V_{REF}$. Specifically, in the voltage comparison circuit 60, one terminal of the resistor R43 is fed with the potential of the predetermined voltage $V_{BG}$, the other terminal of the resistor R43 and one terminal of the resistor R44 are connected together at the node ND42, and the other terminal of the resistor R44 is connected to the ground. In the voltage comparison circuit 60, the voltage that appears at the node ND42 serves as the reference voltage $V_{REF}$, and the node ND42 is connected to the non-inverting input terminal of the comparator CMP.

Figure 14:
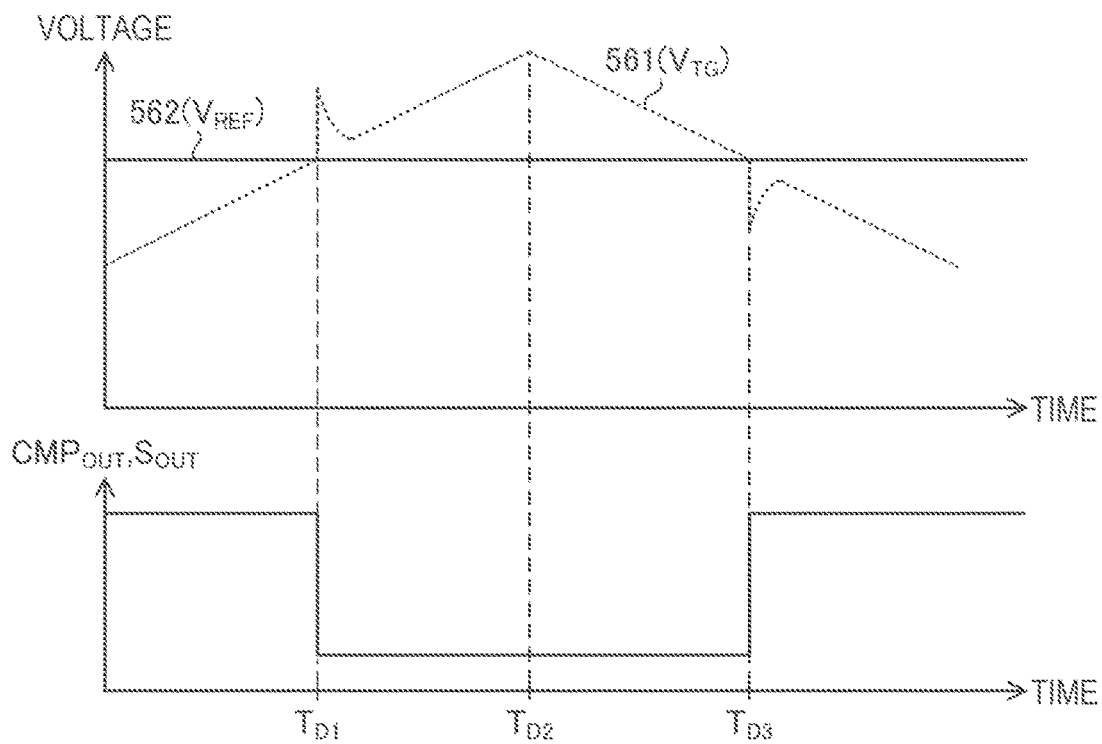
FIG. 14 is a timing chart of the voltage comparison circuit according to the sixth embodiment of the present invention.

FIG. 14 is a timing chart of the voltage comparison circuit 60. In FIG. 14, a partly curved broken-line waveform 561 is the waveform of the target voltage $V_{TG}$, and a solid line segment 562 represents the waveform of the reference voltage $V_{REF}$. The timing chart in FIG. 14 corresponds to assuming $V_{D1}=V_{D2}$ in the timing chart in FIG. 10. As a result of the transistor Tr41 and the resistor R45 in FIG. 9 being omitted, the voltage comparison circuit 60 does not offer the DC hysteresis function but offers the AC hysteresis function, as the voltage comparison circuit 40 does, owing to the capacitor C41 being inserted between the nodes NDa and ND41.

Seventh Embodiment

A seventh embodiment of the present invention will be described. The seventh embodiment provides a supplementary description of the voltage comparison circuits of the first to sixth embodiments as well as a description of applied, modified, and other technical features.

In the embodiments described above, the inverting input terminal and the non-inverting input terminal of the comparator CMP are fed with the target voltage $V_{TG}$ and the reference voltage $V_{REF}$ respectively. The relationship of these voltages can be reversed; the inverting input terminal and the non-inverting input terminal of the comparator CMP can be fed with the reference voltage $V_{REF}$ and the target voltage $V_{TG}$ respectively.

In the embodiments described above, one terminal of the capacitor (C11, C21, C31, or C41) is connected to an output-side node that is fed with a signal corresponding to the output signal $CMP_{OUT}$ of the comparator CMP. In the embodiments described above, the node NDa or NDb serves as the output-side node; instead, the output terminal of the comparator CMP can serve as the output-side node.

Figure 15:
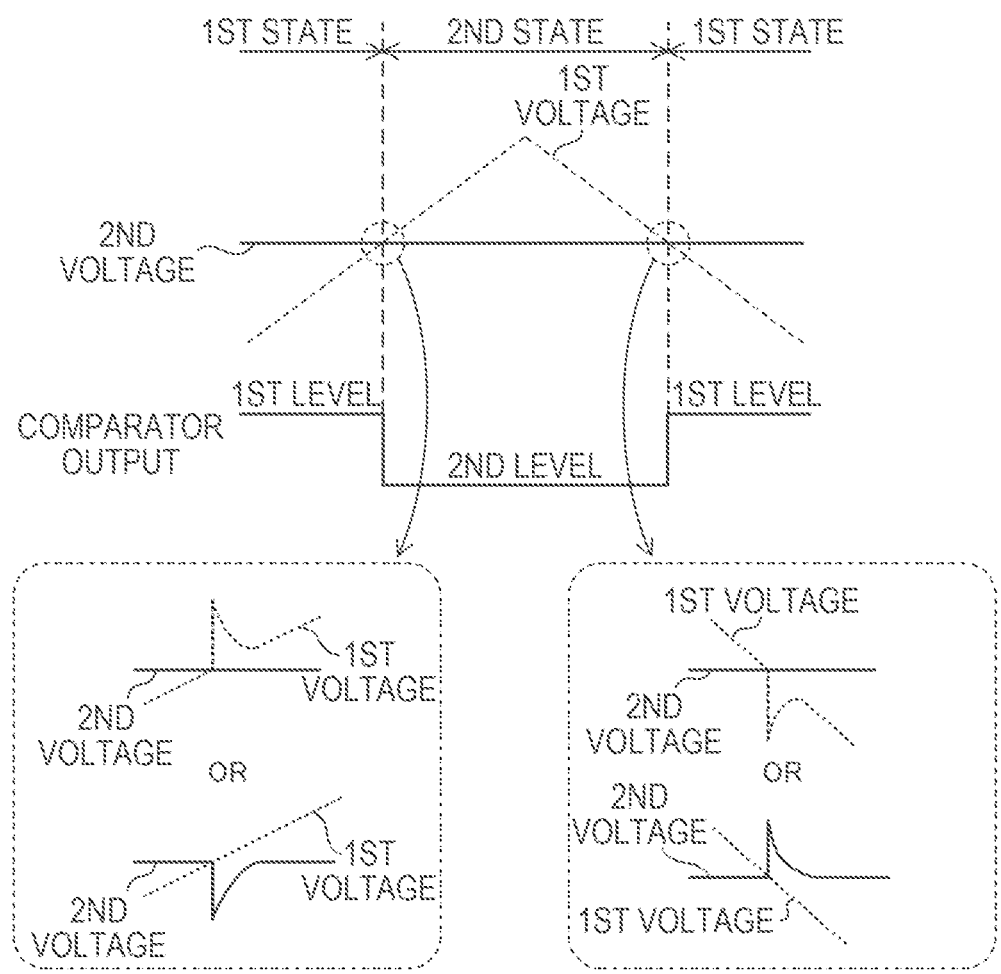
FIG. 15 is a diagram illustrating, in connection with a seventh embodiment of the present invention, the operation of a voltage comparison circuit.

A voltage comparison circuit according to one aspect of the present invention of which specific examples have been presented as the first to sixth embodiments will be referred to, for the sake of convenience, as a voltage comparison circuit W. FIG. 15 is a diagram illustrating the operation of the voltage comparison circuit W. It should be noted that, in FIG. 15, the DC hysteresis function is omitted from illustration.

A voltage comparison circuit W according to one aspect of the present invention includes: a comparator (CMP) configured to receive a first voltage and a second voltage, to output a signal with a predetermined first level (e.g., high level) in a first state (e.g., $V_{TG}<V_{REF}$) where the level of the first voltage (e.g. $V_{TG}$) is lower than the level of the second voltage (e.g. $V_{REF}$), and to output a signal with a predetermined second level (e.g., low level) different from the first level in a second state (e g., $V_{TG}>V_{REF}$) where the level of the first voltage is higher than the level of the second voltage; and a capacitor (C11, C21, C31, C41, C51, C61) inserted between an input-side node fed with the first or second voltage and an output-side node fed with a signal corresponding to the output signal of the comparator.

For example, in the voltage comparison circuit W, preferably, as shown in FIG. 15.

when a shift from the first state to the second state causes a change in the level of the output signal of the comparator from the first level to the second level, an alternating-current signal based on the change is delivered from the output-side node via the capacitor to the input-side node so that the alternating-current signal is superposed on the first or second voltage, and thereby the level of the first voltage is momentarily raised or the level of the second voltage is momentarily lowered.

In other words, in the voltage comparison circuit W, preferably, when a shift from the first state to the second state causes a change in the level of the output signal of the comparator from the first level to the second level, the capacitor delivers an alternating-current signal based on the change from the output-side node to the input-side node so as to superpose the alternating-current signal on the first or second voltage, and thereby to raise the level of the first voltage momentarily or to lower the level of the second voltage momentarily.

For another example, in the voltage comparison circuit W, preferably, as shown in FIG. 15.

when a shift from the second state to the first state causes a change in the level of the output signal of the comparator from the second level to the first level, an alternating-current signal based on the change is delivered from the output-side node via the capacitor to the input-side node so that the alternating-current signal is superposed on the first or second voltage, and thereby the level of the first voltage is momentarily lowered or the level of the second voltage is momentarily raised.

In other words, in the voltage comparison circuit W, preferably, when a shift from the second state to the first state causes a change in the level of the output signal of the comparator from the second level to the first level, the capacitor delivers an alternating-current signal based on the change from the output-side node to the input-side node so as to superpose the alternating-current signal on the first or second voltage, and thereby to lower the level of the first voltage momentarily or to raise the level of the second voltage momentarily Specifically, for example, in the voltage comparison circuit W, preferably, the comparator has a first input terminal (e.g., inverting input terminal) for receiving the first voltage and a second input terminal (e g., non-inverting input terminal) for receiving the second voltage, the input-side node is the first or second input terminal, and the output-side node is fed with a signal of which the level changes synchronously as the level of the output signal of the comparator changes.

In the voltage comparison circuit W, for example, the first and second voltages correspond to the target voltage $V_{TG}$ and reference voltage $V_{REF}$ respectively, but their correspondence can be reversed.

In the voltage comparison circuit W, for example, the first and second levels correspond to high level and low level respectively, but their correspondence can be reversed.

In the voltage comparison circuit W, for example, the first and second input terminals of the comparator correspond to the inverting input terminal and the non-inverting input terminal respectively, but their correspondence can be revered.

In the voltage comparison circuit W, the output-side node corresponds to the node NDa or NDb mentioned above, but the output terminal of the comparator (CMP) can itself be the output-side node.

In the voltage comparison circuit W, the input-side node can be understood to be connected to the first or second input terminal of the comparator.

More specifically, for example (see FIGS. 1, 7, and 11), in the voltage comparison circuit W, preferably, there is further provided a second-voltage division circuit (DIV12, DIV32, DIV12') configured to generate the second voltage by dividing a predetermined voltage ($V_{BG}$) using a plurality of voltage division resistors connected in series with each other. Preferably, the capacitor is inserted between the output-side node and the second input terminal as the input-side node, the second voltage appears at the connection node between a first voltage division resistor and a second voltage division resistor included in the plurality of voltage division resistors, and the connection node is connected to the second input terminal of the comparator.

Here, preferably, the capacitor and the voltage division resistors in the second-voltage division circuit together constitute a high-pass filter so that, when the level of the output signal of the comparator changes between the first and second levels, an alternating-current signal based on the change is delivered from the output-side node via the capacitor to the second input terminal, and thereby the alternating-current signal is superposed on the second voltage.

Or, specifically, for example (see FIGS. 5, 9, and 13), in the voltage comparison circuit W, preferably, there is further provided a first-voltage division circuit (DIV21, DIV41) configured to generate the first voltage by dividing an input voltage ($V_{IN}$) using a plurality of voltage division resistors connected in series with each other. Preferably, the capacitor is inserted between the output-side node and the first input terminal as the input-side node, the first voltage appears at the connection node between a first voltage division resistor and a second voltage division resistor included in the plurality of voltage division resistors, and the connection node is connected to the first input terminal of the comparator.

Here, preferably, the capacitor and the voltage division resistors in the first-voltage division circuit together constitute a high-pass filter so that, when the level of the output signal of the comparator changes between the first and second levels, an alternating-current signal based on the change is delivered from the output-side node via the capacitor to the first input terminal, and thereby the alternating-current signal is superposed on the first voltage.

A voltage comparison circuit W of which examples have been presented as the voltage comparison circuits 10, 20, 30, 40, 50, and 60 can be incorporated in any device that requires voltage comparison. For example, a voltage comparison circuit W can be incorporated in a vehicle-mounted appliance that is installed on a vehicle such as an automobile. For another example, a voltage comparison circuit W can be incorporated in a mobile data terminal (personal digital assistant) such as a smartphone or a tablet computer.

The channel types of the FETs (field-effect transistors) in the embodiments are only illustrative: the configuration of any of the circuits including FETs described above can be modified such that, for example, an N-channel FET is replaced with a P-channel FET.

Any of the transistors mentioned above can be of any type: for example, any of the transistors mentioned as MOSFETs in the above description can be replaced with a junction FET, an IGBT (insulated-gate bipolar transistor), or a bipolar transistor.

Any of the voltage comparison circuits (10, 20, 30, 40, 50, and 60) presented as embodiments can be implemented in the form of a semiconductor integrated circuit. It is possible to build a semiconductor device having a semiconductor integrated circuit that includes a voltage comparison circuit and a housing that accommodates the semiconductor integrated circuit.

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

What is claimed is:
1. A voltage comparison circuit comprising:
   a comparator having
      an output terminal,
      a first input terminal fed with a first voltage, and
      a second input terminal fed with a second voltage,
   the comparator being configured
      to output from the output terminal a signal with a predetermined first level in a first state where a level of the first voltage is lower than a level of the second voltage, and
      to output from the output terminal a signal with a predetermined second level different from the first level in a second state where the level of the first voltage is higher than the level of the second voltage;
   a logic circuit configured to output a binary signal in accordance with an output signal of the comparator;
   a capacitor, and
   a voltage division circuit configured to divide a predetermined voltage using a plurality of voltage division resistors connected in series with each other,
   wherein
   one end of the capacitor is connected to the second input terminal,
   another end of the capacitor is fed with the binary signal,
   the second voltage appears at a connection node between first and second voltage division resistors included in the plurality of voltage division resistors, the connection node being connected to the second input terminal of the comparator,
   the capacitor and the voltage division resistors in the voltage division circuit constitute a high-pass filter, and the high-pass filter is configured such that, when a rise in the first voltage causes a change of a level of the output signal of the comparator from the first level to the second level, the high-pass filter delivers an alternating-current signal based on the change to the second input terminal and thereby momentarily lowers the second voltage to less than a value that depends, at least in part, on respective values of the first and second voltage division resistances.

2. The voltage comparison circuit according to claim 1, wherein
the voltage division circuit is configured to give the comparator hysteresis by varying, in accordance with the output signal of the comparator, a division ratio used when the second voltage is generated from the predetermined voltage.

3. The voltage comparison circuit according to claim 1, further comprising:
another voltage division circuit configured to generate the first voltage by dividing an input voltage using a plurality of other voltage division resistors connected in series with each other,
wherein the another voltage division circuit is configured to give the comparator hysteresis by varying, in accordance with the output signal of the comparator, a division ratio used when the first voltage is generated from the input voltage.

4. A semiconductor device including the voltage comparison circuit according to claim 1, wherein the voltage comparison circuit is formed as a semiconductor integrated circuit.

* * * * *